US012560422B2

(12) United States Patent
Chien

(10) Patent No.: US 12,560,422 B2
(45) Date of Patent: Feb. 24, 2026

(54) OPTICAL SYSTEM FOR MEASURING THE DEPTH OF AN INNER LAYER OF A PRINTED CIRCUIT BOARD

(71) Applicant: NANJING TALIANG TECHNOLOGY CO., LTD., Nanjing (CN)

(72) Inventor: Chen-Chi Chien, Nanjing (CN)

(73) Assignee: NANJING TALIANG TECHNOLOGY CO., LTD., Jiangsu Province (CN)

( * ) Notice: Subject to any disclaimer, the term of this patent is extended or adjusted under 35 U.S.C. 154(b) by 147 days.

(21) Appl. No.: 18/281,303

(22) PCT Filed: Mar. 24, 2021

(86) PCT No.: PCT/CN2021/000049

§ 371 (c)(1),
(2) Date: Sep. 10, 2023

(87) PCT Pub. No.: WO2022/198346

PCT Pub. Date: Sep. 29, 2022

(65) Prior Publication Data

US 2024/0159517 A1     May 16, 2024

(51) Int. Cl.
H05K 3/00 (2006.01)
G01B 11/22 (2006.01)

(52) U.S. Cl.
CPC ............... *G01B 11/22* (2013.01); *H05K 3/00* (2013.01); *H05K 2203/16* (2013.01)

(58) Field of Classification Search
CPC ........ G01B 11/22; G01B 11/026; H05K 3/00; H05K 2203/16; H05K 3/0047
(Continued)

(56) References Cited

U.S. PATENT DOCUMENTS 8,841,603 B1 * 9/2014 Blanton ................. G01N 21/01
356/640
9,188,775 B2 * 11/2015 Blanton ................. G07C 3/143
(Continued)

FOREIGN PATENT DOCUMENTS

CN        2492041 Y        5/2002
CN        101206183 A   *   6/2008   ........... G01N 21/954
(Continued)

OTHER PUBLICATIONS

Machine translation of CN101206183A, Jun. 25, 2008.
(Continued)

*Primary Examiner* — Isiaka O Akanbi

(57) ABSTRACT
An optical system for measuring the depth of an inner layer of a PCB, includes a light source transmitter used to emit an incident light, a controller, a CCD lens module, a pellicle mirror module, a depth measuring device, a reflective mirror module set at one end of the depth measuring device at an angle of 45 degrees, and a processor. When the incident light is incident on the surface copper of the PCB, a first reflected light is generated to pass through the reflective mirror module and the pellicle mirror module to the CCD lens module, then, the depth measuring device starts to move in the PCB until the incident light is incident on the inner layer copper of the PCB to generate a second reflected light that passes through the reflective mirror module and the pellet mirror module to the CCD lens module.

2 Claims, 5 Drawing Sheets

(58) Field of Classification Search
USPC ................................. 356/601, 602, 626, 624
See application file for complete search history.

(56) References Cited

U.S. PATENT DOCUMENTS

| | | | | |
|---|---|---|---|---|
| 10,914,687 | B2* | 2/2021 | Wagner | .............. G01B 11/2518 |
| 2009/0237677 | A1* | 9/2009 | Aoki | ........................ G01B 11/12 |
| | | | | 356/602 |
| 2010/0060904 | A1* | 3/2010 | Keightley | .......... G01B 11/2513 |
| | | | | 356/608 |
| 2010/0328780 | A1* | 12/2010 | Tocci | ................... H04N 23/741 |
| | | | | 359/636 |
| 2011/0096207 | A1* | 4/2011 | Izumi | .................... G03B 19/12 |
| | | | | 348/241 |
| 2014/0226156 | A1* | 8/2014 | Bergman | ............. G01N 21/954 |
| | | | | 356/241.1 |
| 2014/0253913 | A1* | 9/2014 | Bergman | ............. G01N 21/954 |
| | | | | 356/241.1 |
| 2015/0015288 | A1 | 1/2015 | Ma | |
| 2015/0043901 | A1* | 2/2015 | Yamada | ................. G03B 19/12 |
| | | | | 396/358 |
| 2015/0062585 | A1* | 3/2015 | Blanton | ............. G01B 11/2518 |
| | | | | 359/205.1 |

FOREIGN PATENT DOCUMENTS

| | | | | |
|---|---|---|---|---|
| CN | 109121305 | A * | 1/2019 | .......... H05K 3/0047 |
| CN | 109540020 | A | 3/2019 | |
| CN | 110022648 | A | 7/2019 | |

OTHER PUBLICATIONS

Machine translation of CN109121305A, Jan. 1, 2019.
Machine translation of CN110022648A, Jul. 16, 2019.
Machine translation of CN24920421Y, May 15, 2002.
Machine translation of CN109540020A, Mar. 29, 2019.
International Search Report for PCT/CN2021/000049, Dec. 22, 2021.

* cited by examiner

OPTICAL SYSTEM FOR MEASURING THE DEPTH OF AN INNER LAYER OF A PRINTED CIRCUIT BOARD

BACKGROUND OF THE INVENTION

1. Field of the Invention

The present invention relates to a depth measurement system, especially an optical system for measuring the depth of an inner layer of a printed circuit board.

2. Description of the Related Art

Printed circuit boards are used to implement many electronic systems, such as computer systems. A typical printed circuit board includes multiple conductive layers separated from each other by layers of dielectric material. Certain conductive layers may be dedicated to power or ground, while others may be dedicated to providing signal paths for connecting the various components to be mounted on the printed circuit board. Many printed circuit boards may initially be manufactured with a structure called a test coupon (or more simply, a coupon). A coupon is a structure implemented in a printed circuit board that can be used for some kind of testing during the manufacturing or post-manufacturing (but pre-operational) stages of the printed circuit board. The coupon can thus be separated from the design of the board itself in terms of its operational function. In some cases, coupons may be implemented on the printed circuit board itself, while in other cases, coupons may be implemented on a separate portion of the panel that is discarded after fabrication, assembly, and testing have been completed. Coupons may be implemented for a wide variety of tests. For example, coupons may be implemented on a printed circuit board (or a separate structure attached to it during manufacture) for impedance testing, various electrical connection tests, etc.

In order to arrange complex circuits on the same circuit board, a multi-layer circuit board was developed. A multi-layer circuit board includes multiple dielectric layers and multiple circuit layers stacked alternately. In order to electrically connect at least two circuit layers to each other, through holes are first formed on the multilayer circuit board, and then conductive substances (such as: copper) are deposited in the through holes to form conductive vias, to electrically connect at least two circuit layers. However, the conductive vias each have a stub located below the at least two circuit layers, and the stub is not conducive to the transmission of electrical signals. Therefore, a back drilling technique has been developed to drill off the stubs of the conductive vias. In the back drilling technology, in order to accurately remove the stub of the conductive via and retain the conductive part of the conductive via, the control of the drilling depth of the drill bit is extremely important. In the prior art, the drilling system drills the same batch of circuit boards according to the same preset drilling depth. However, there are many variations in the thickness of the same batch of circuit boards, if all the circuit boards are drilled with the same preset drilling depth, it will often cause some circuit boards to be defective. For example, as shown in FIGS. 1 and 2, when the drill 110 starts to drill down on the surface of the printed circuit board and the outer layer of copper AA, it is impossible to know exactly how much the drilling depth L should be to remove the copper CC to avoid becoming residual copper and affecting the electrical signal effect of the inner layer copper BB. Therefore, how to solve the above-mentioned problems and deficiencies of the prior art is a subject that the relevant industry is eager to research and develop.

SUMMARY OF THE INVENTION

The present invention provides an optical system for measuring the depth of an inner layer of a printed circuit board, which can effectively and accurately measure the critical length of drill-down.

The present invention provides an optical system for measuring the depth of an inner layer of a printed circuit board. The optical system for measuring the depth of an inner layer of a printed circuit board comprises a light source transmitter, a controller, a CCD lens module, a pellicle mirror module, a depth measuring device, a reflective mirror module and a processor. The light source transmitter is used to emit an incident light. The CCD lens module is connected to and controlled by the controller. The pellicle mirror module is connected to the CCD lens module. The incident angle of the incident light on the pellicle mirror module is 45 degrees. The depth measuring device is connected to and controlled by the controller, and the depth measuring device and the pellicle mirror module are parallel and opposite to each other and move in the same direction. The reflective mirror module is connected to the depth measuring device. The reflective mirror module is set at one end of the depth measuring device at an angle of 45 degrees, so that the incident angle of the incident light passing through the pellicle mirror module and the reflective mirror module is 45 degrees. The processor is connected to and controlled by the controller, and the processor is used to calculate relevant data. When the incident light is incident on the surface copper of the printed circuit board, a first reflected light will be generated, and its optical path is through the reflective mirror module and the pellicle mirror module to the CCD lens module. Next, the depth measuring device starts to move in the internal space of the printed circuit board until the incident light is incident on the inner layer copper of the printed circuit board to generate a second reflected light, and its optical path is through the reflective mirror module and the pellicle mirror module to the CCD lens module.

In one embodiment of the present invention, the depth measuring device moves in the internal space of the printed circuit board until the distance from the incident light to the second reflected light generated by the inner layer copper of the printed circuit board is the critical length of drill-down.

In one embodiment of the present invention, when the CCD lens module receives the first reflected light, it means that the depth measurement is about to start, which is the initial measurement state. In one embodiment of the present invention, when the CCD lens module receives the first reflected light, it means that the depth measurement is about to start, which is the initial measurement state.

In an embodiment of the present invention, when the CCD lens module receives the second reflected light, it means that the depth measurement has been completed, which is the measurement completion state.

In one embodiment of the present invention, the controller controls the light source transmitter to emit the incident light, and the depth measuring device starts to measure and move according to the first reflected light received by the CCD lens module.

In one embodiment of the present invention, the controller controls the light source transmitter to emit the incident light, and controls the depth measuring device to stop measuring movement according to the second reflected light received by the CCD lens module.

In one embodiment of the present invention, the controller sends relevant data to the processor for processing.

In summary, the optical system for measuring the depth of the inner layer of the printed circuit board provided by the present invention can achieve the following effects:

1. It can effectively and accurately measure the critical length of drill-down.
 2. It can effectively eliminate residual copper to solve the adverse effects of electrical signals.
 3. It can improve production efficiency and save costs.

The following will be described in detail through a preferred embodiment, when it is easier to understand the purpose, technical content, characteristics and effects of the present invention.

DETAILED DESCRIPTION OF THE PREFERRED EMBODIMENT

In order to solve the problem that the drilling depth of the existing drill bits is difficult to determine, the inventor of the present invention has improved the existing products after years of research and development. The follow-up will introduce in detail how the present invention uses the optical system for measuring the depth of an inner layer of a printed circuit board to achieve the most efficient functional demands.

Figure 1:
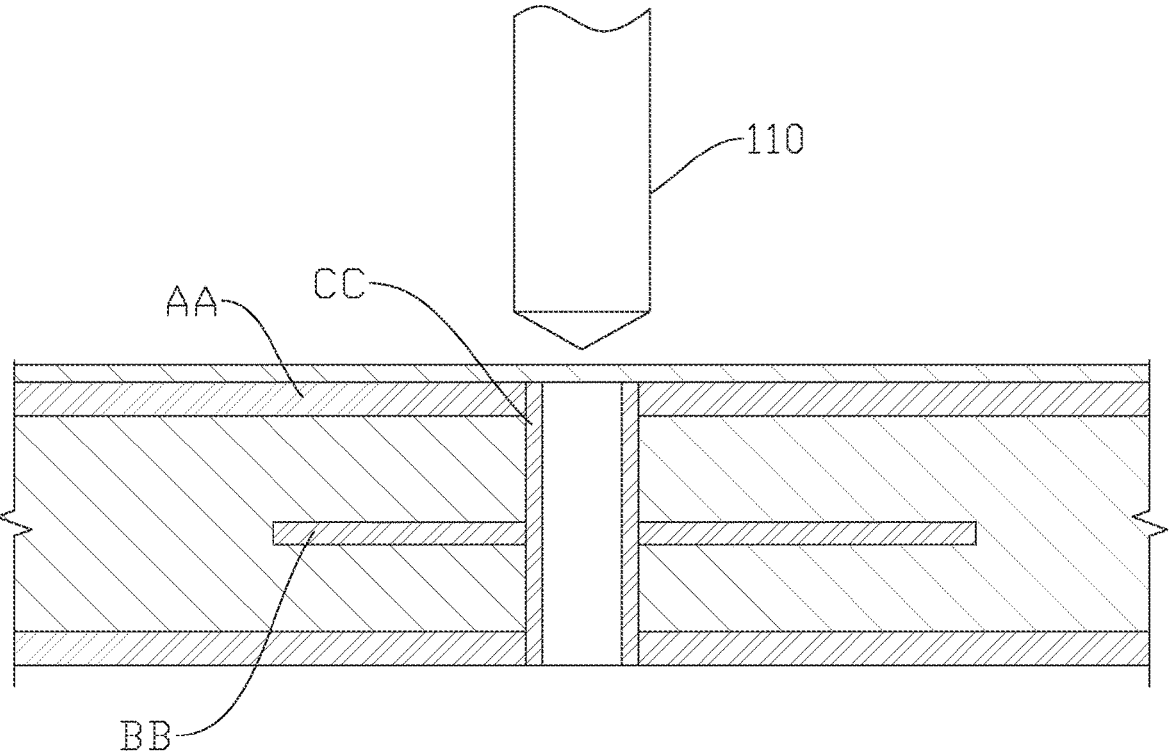
FIG. 1 is a schematic diagram of a drill and a printed circuit board in the prior art.
Figure 2:
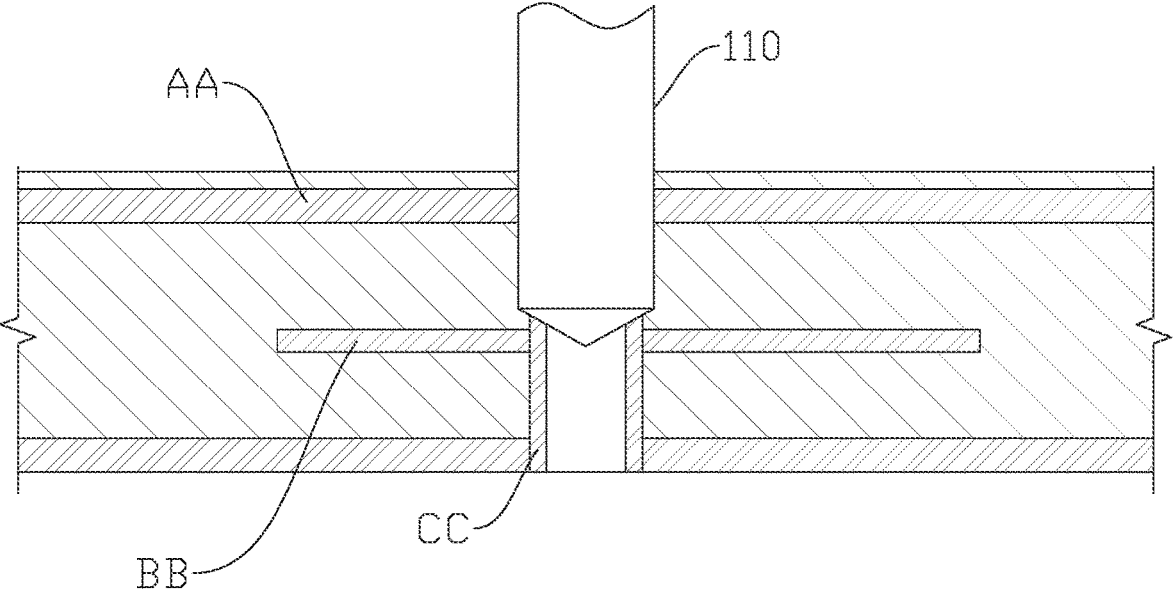
FIG. 2 is a schematic diagram of drilling down of the drill to the printed circuit board in the prior art.
Figure 3:
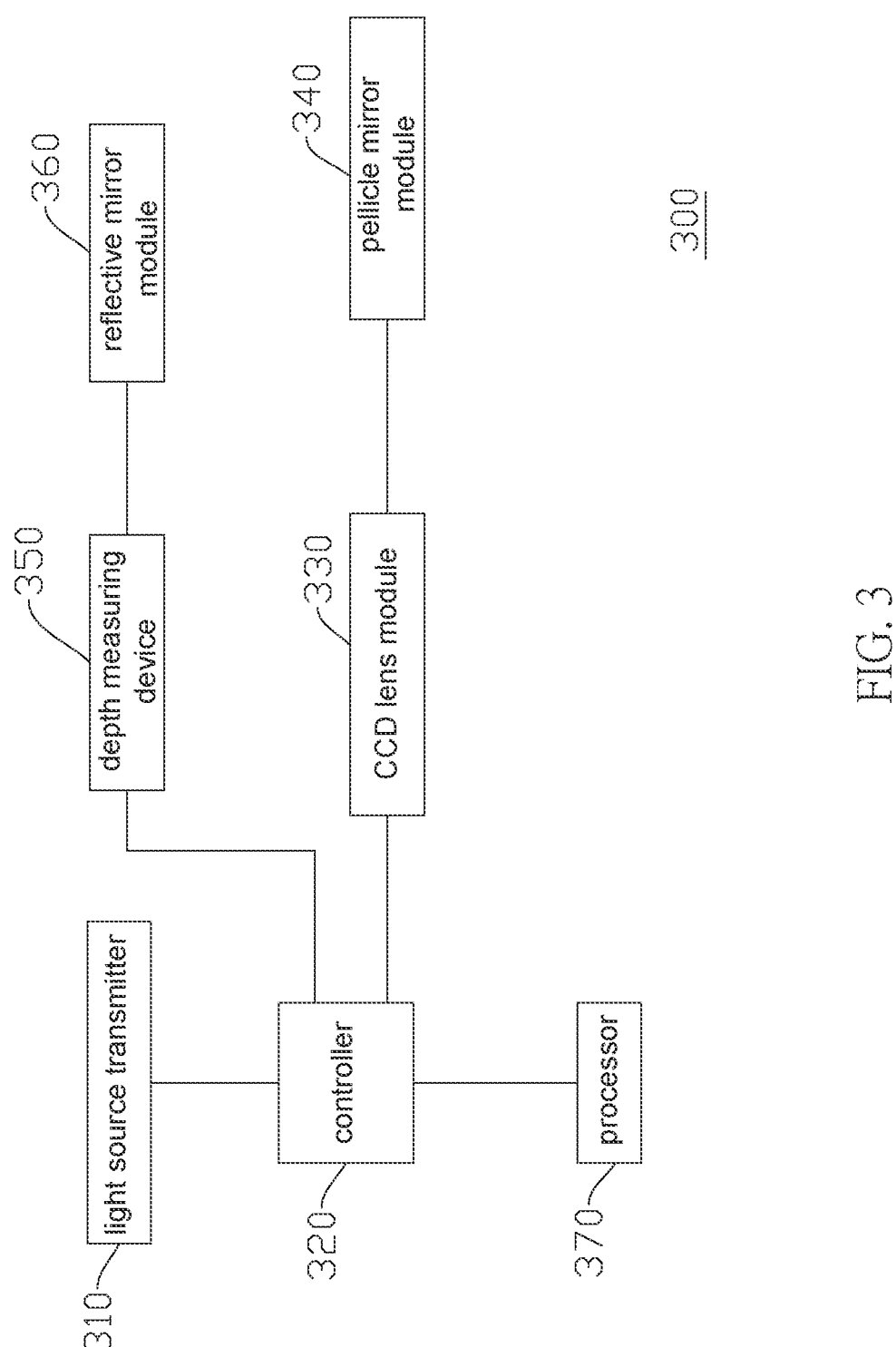
FIG. 3 is a block diagram of the optical system for measuring the depth of an inner layer of a printed circuit board of the present invention.
Figure 4:
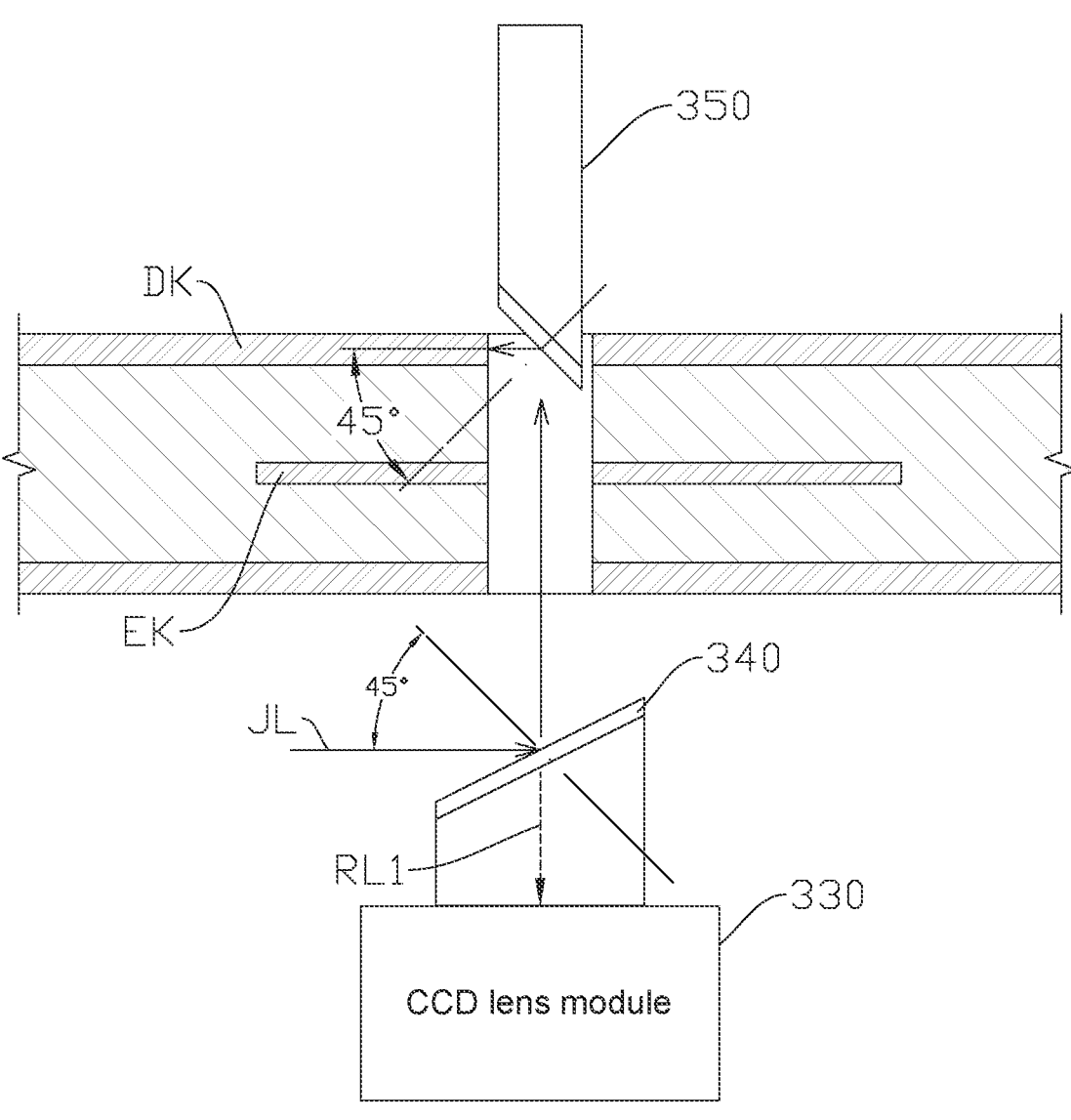
FIG. 4 is a schematic diagram of the initial measurement state of the printed circuit board inner layer depth measurement optical system of the present invention.
Figure 5:
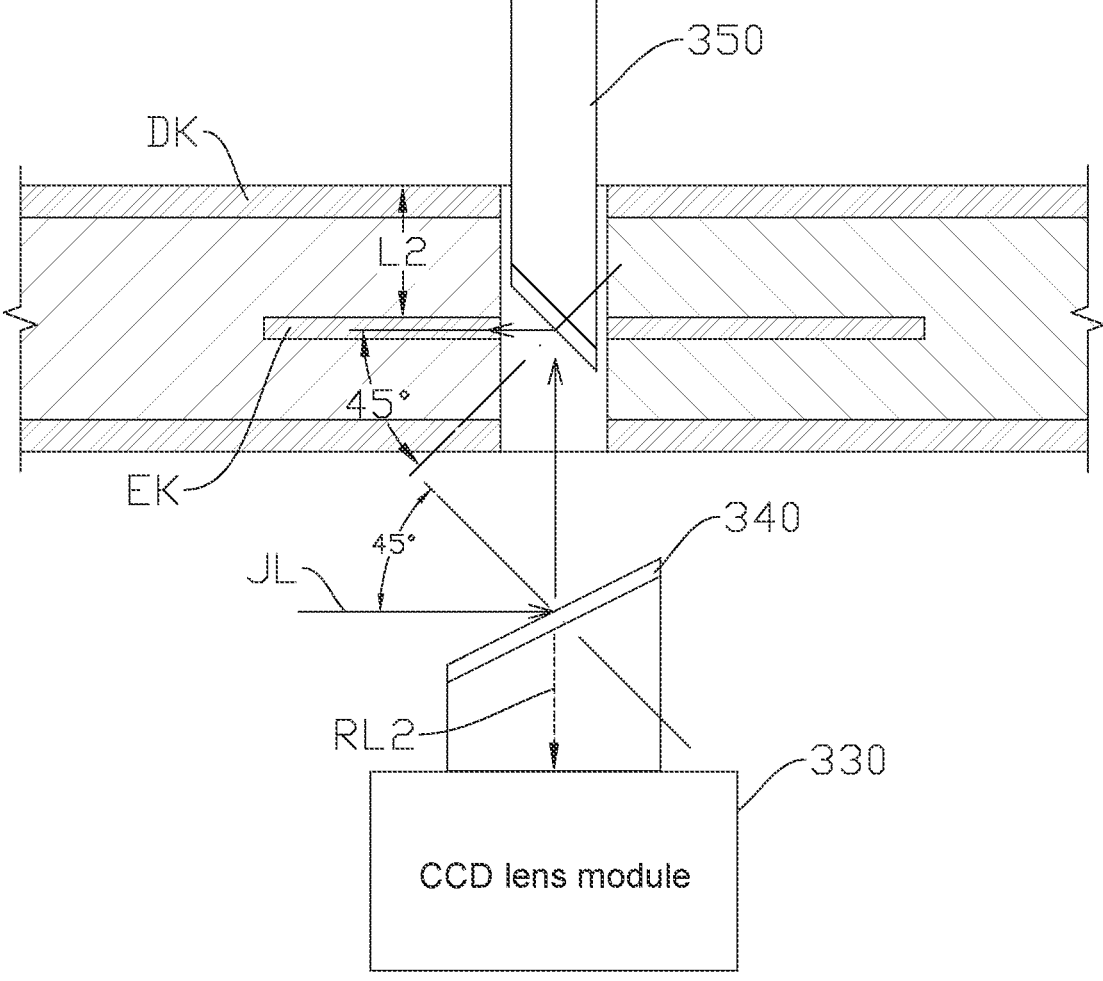
FIG. 5 is a schematic diagram of the completed measurement state of the printed circuit board inner layer depth measurement optical system of the present invention.

Please refer to FIGS. 3 to 5 at the same time, where FIG. 3 is a block diagram of the optical system for measuring the depth of an inner layer of a printed circuit board of the present invention, FIG. 4 is a schematic diagram of the initial measurement state of the printed circuit board inner layer depth measurement optical system of the present invention, and FIG. 5 is a schematic diagram of the completed measurement state of the printed circuit board inner layer depth measurement optical system of the present invention. The optical system 300 for measuring the depth of an inner layer of a printed circuit board comprises a light source transmitter 310, a controller 320, a CCD lens module 330, a pellicle mirror module 340, a depth measuring device 350, a reflective mirror module 360 and a processor 370. CCD is a charge-coupled device (abbreviation: CCD). The CCD lens module 330 is connected to and controlled by the controller 320. The pellicle mirror module 340 is connected to the CCD lens module 330. The depth measuring device 350 is connected to and controlled by the controller 320. The reflective mirror module 360 is connected to the depth measuring device 350. The processor 370 is connected to and controlled by the controller 320. The light source transmitter 310 is used to emit an incident light JL (visible light), and the incident angle of the incident light JL on the pellicle mirror module 340 is 45 degrees. The depth measuring device 350 and the pellicle mirror module 340 are parallel and opposite to each other and will move in the same direction when starting the formal measurement. The reflective mirror module 360 is set at one end of the depth measuring device 350 at an angle of 45 degrees, so that the incident angle of the incident light JL passing through the pellicle mirror module 340 and the reflective mirror module 360 is 45 degrees.

The working mechanism of the optical system 300 for measuring the depth of an inner layer of a printed circuit board of the present invention will be further described in detail below.

The controller 320 controls the light source transmitter 310 to emit incident light JL, and the depth measuring device 350 starts to measure and move according to the first reflected light RL1 received by the CCD lens module 330. That is to say, when the incident light JL is incident on the surface copper DK of the printed circuit board, the first reflected light RL1 will be generated, and its optical path is through the reflective mirror module 360 and the pellicle mirror module 340 to the CCD lens module 330. Next, the controller 320 controls the light source transmitter 310 to continue emitting the incident light JL and controls the depth measuring device 350 to stop the measurement movement according to the second reflected light RL2 received by the CCD lens module 330. That is to say, the depth measuring device 350 starts to move in the inner space of the printed circuit board until the incident light JL is incident on the inner layer copper EK of the printed circuit board to generate the second reflected light RL2, and its optical path is through the reflective mirror module 360 and the pellicle mirror module 340 to the CCD lens module 330.

It is worth mentioning that the depth measuring device 350 moves in the internal space of the printed circuit board until the distance from the incident light JL to the second reflected light RL2 generated by the inner layer copper EK of the printed circuit board is the critical length of drill-down L2, which is also the true and effective distance from the surface copper to the inner layer copper. This is more accurate and effective than any traditional measurement method. The controller 320 transmits the relevant data to the processor 370 for processing, and the processor 370 is used to calculate the relevant data to obtain the critical length of drill-down L2. When the CCD lens module 330 receives the first reflected light RL1, it means that the depth measurement is about to start, which is the initial measurement state. When the CCD lens module 330 receives the second reflected light RL2, it means that the depth measurement has been completed, which is the measurement completion state.

In summary, the optical system for measuring the depth of the inner layer of the printed circuit board provided by the present invention can achieve the following effects:

1. It can effectively and accurately measure the critical length of drill-down.
 2. It can effectively eliminate residual copper to solve the adverse effects of electrical signals.
 3. It can improve production efficiency and save costs.

What is claimed is:

1. An optical system for measuring the depth of an inner layer of a printed circuit board, comprising:
 a light source transmitter for emitting an incident light towards a first side of a printed circuit board;
 a controller;
 a CCD lens module connected to and controlled by said controller;

a pellicle mirror module connected to said CCD lens module, an incidence angle of said incident light on said pellicle mirror module being 45 degrees;

a depth measuring device connected to and controlled by said controller, said depth measuring device and said pellicle mirror module being parallel and opposite to each other and configured to move in a same direction, said depth measuring device configured to advance into said printed circuit board from a second side of said printed circuit board opposite the first side;

a reflective mirror module connected to said depth measuring device, said reflective mirror module being set at one end of said depth measuring device at an angle of 45 degrees, so that an incident angle of said incident light transmitted by said pellicle mirror module and said reflective mirror module is 45 degrees; and a processor connected to and controlled by said controller, said processor being used to calculate relevant data;

wherein when said incident light traveling past said first surface towards said second surface to reflect from reflective mirror module is incident on surface copper of a printed circuit board, a first reflected light is generated, and an optical path of said first reflected light is transmitted to said CCD lens module via said reflective mirror module and said pellicle mirror module;

wherein said depth measuring device is movable in an internal space of said printed circuit board from said second surface towards said first surface until said incident light is incident on an inner copper layer of said printed circuit board to generate a second reflected light, and an optical path of said second reflected light is transmitted by said reflective mirror module and said pellicle mirror module to said CCD lens module;

wherein said depth measuring device moves in the internal space of said printed circuit board towards the first surface a distance from the surface copper to the inner copper layer according to said second reflected light generated by the inner layer copper of said printed circuit board to measure a critical length of drill-down;

wherein when said CCD lens module receives said first reflected light, a depth measurement is to be started, which is an initial measurement state;

wherein when said CCD lens module receives said second reflected light, the depth measurement is completed, which is a measurement completion state;

wherein said controller controls said light source transmitter to emit said incident light, and said depth measuring device starts to measure and move according to said first reflected light received by said CCD lens module; and wherein said controller controls said depth measuring device to stop measuring movement according to said second reflected light received by said CCD lens module.

2. The optical system for measuring the depth of an inner layer of a printed circuit board as claimed in claim 1, wherein said controller sends relevant data to said processor for processing.

\* \* \* \* \*